United States Patent [19]
Huang

[11] Patent Number: 5,821,141
[45] Date of Patent: Oct. 13, 1998

[54] METHOD FOR FORMING A CYLINDRICAL CAPACITOR IN DRAM HAVING PIN PLUG PROFILE

[75] Inventor: Jenn Ming Huang, Hsin-Chu, Taiwan

[73] Assignee: Taiwan Semiconductor Manufacturing Company, Ltd, Hsin-Chu, Taiwan

[21] Appl. No.: 6,043

[22] Filed: Jan. 12, 1998

[51] Int. Cl.[6] .............................................. H01L 21/8242
[52] U.S. Cl. ........................................... 438/253; 438/254
[58] Field of Search ............................ 438/381, 396–399, 438/238–240, 253–256

[56] References Cited

U.S. PATENT DOCUMENTS

| | | | |
|---|---|---|---|
| 5,281,549 | 1/1994 | Fazan et al. | 437/52 |
| 5,354,705 | 10/1994 | Mathews et al. | 437/52 |
| 5,405,796 | 4/1995 | Jones, Jr. | 437/47 |
| 5,453,403 | 9/1995 | Meng et al. | 437/195 |
| 5,595,929 | 1/1997 | Tseng . | |
| 5,597,756 | 1/1997 | Fazan et al. | 437/52 |
| 5,629,237 | 5/1997 | Wang et al. | 438/701 |
| 5,686,337 | 11/1997 | Koh et al. . | |

*Primary Examiner*—Jey Tsai
*Attorney, Agent, or Firm*—George O. Saile; Stephen B. Ackerman; William J. Stoffel

[57] ABSTRACT

The invention provides a method of manufacturing a cylindrical capacitor for a DRAM that has a pin shaped plug 42 that increases the photo alignment tolerances between a pin plug 42 and a cylindrical top crown 50A. The invention provides a capacitor structure with a pin shaped plug hole 40 (40A 40B) that has a wide upper hemispherical plug hole 40B and a narrower cylindrical lower plug hole 40A. There are two embodiments to forming the pin plug hole 40. In the first embodiment, (1) an isotropic etch forms the wide upper hemispherical plug hole 40B followed by, (2) an anisotropic etch forms the narrower cylindrical lower plug hole 40B. In the second embodiment, the first insulating layer 30 is composed of an upper layer 30B (with a fast wet etch rate) and a lower layer 30A (with a slow wet etch rate). Then the layer 30 is etched by a wet and a dry etch (in either order) to form the pin plug opening 30.

25 Claims, 6 Drawing Sheets

METHOD FOR FORMING A CYLINDRICAL CAPACITOR IN DRAM HAVING PIN PLUG PROFILE

BACKGROUND OF INVENTION

1) Field of the Invention

This invention relates generally to semiconductor fabrication and in particular to a fabrication method which provides a cylindrical capacitor structure for a dynamic random access memory (DRAM) device and more particularly to an etch process to form a bottom electrode with a pin shaped plug portion.

2) Description of the Prior Art

As semiconductor devices become more and more dense, it has become necessary to maximize the amount of die space used in order to successfully manufacture these dense devices while retaining relatively small package sizes. This is particularly true with dynamic random access memories as memory density has increased while the space allowed for each storage capacitor has decreased.

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

U.S. Pat. No. 5,597,756(Fazan) (Frazan's FIGS. 1–7) shows the formation of a cylindrical storage electrode 18A 51. However, the applicant has experienced a major problem in the manufacture of a high density cylindrical capacitor. When the opening that forms the upper cylindrical portion of the storage node is misaligned, defects are etched into the first insulating layer and devices are shorted out. This mis-alignment problems gets worse as minimum dimensions are reduces in the submicron range and more device types are embedded in the same chip. Therefore a new process for forming cylindrical capacitors is needed that increases the photo alignment tolerances between the top cylindrical portion and the underlying plug of the storage electrode.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,354,705 (Mathews), U.S. Pat. No. 5,597,756 (Fazan), U.S. Pat. No. 5,281,549 (Fazan) and U.S. Pat. No. 5,405,796 (Jones) all show two part capacitors where the second part is formed over a lower first part. U.S. Pat. No. 5,453,403 (Meng) and U.S. Pat. No. 5,629,237(Wang) show methods for forming tapered contact via holes.

SUMMARY OF THE INVENTION

It is an object of the present invention to provide a method for fabricating a bottom plug with a pin profile with a wide top (hemispherical) portion and a cylindrical bottom plug portion.

It is an object of the present invention to provide a method for fabricating a cylindrical crown capacitor having a bottom pin plug that increases the photo alignment tolerances between the pin plug and the cylindrical crown.

It is an object of the present invention to provide a method for fabricating a cylindrical crown capacitor having a bottom pin plug that increases the photo alignment tolerances between the pin plug and nearby conductive layer (e.g., poly bit lines) in the surrounding dielectric layer.

To accomplish the above objectives, the present invention provides a method of manufacturing a cylindrical capacitor for a DRAM that has a pin plug 42 that increases the photo tolerances between the pin plug 42 and the cylindrical crown 50A. The invention provides a capacitor structure with a pin plug hole 40 that has a wide upper hemispherical plug hole 40B and a narrower cylindrical lower plug hole 40A. There are two embodiments to forming the pin plug hole 40. In the first embodiment, (1) an isotropic etch forms the wide upper hemispherical plug hole 40B followed by (2) an anisotropic etch forms the narrower cylindrical lower plug hole 40B. In the second embodiment, the first insulating layer 30 is composed of an upper layer 30B (with a fast wet etch rate) and a lower layer 30A (with a slow wet etch rate). Then the layer 30 is etch by a wet and a dry etch (in either order) to form the pin plug opening 30.

In more detail, the invention's method for manufacturing a cylindrical capacitor for a memory device, comprising the steps of:

a) See FIG. 1—providing a substrate having a node contact region 18 (e.g., source region) and device structures formed over the substrate 10;

b) See FIG. 1—forming a first insulating layer 30 over the device structures and the substrate 10;

c) See FIG. 1—forming an etch barrier layer 34 over the first insulating layer 30 30A 30B;

d) forming a pin plug hole 40 through to the etch barrier layer 34 and the first insulating layer 30 to expose the node contact region on the substrate;

(1) the pin plug hole 40 comprised of a cylindrical lower plug hole 40A and a hemispherical upper plug hole 40B; the cylindrical lower plug hole 40A has a smaller open dimension than the a hemispherical upper plug hole 40B;

e) See FIG. 1—forming a pin plug 42 filling the pin plug hole 40 making electrical and mechanical contact with the node contact region; (There are two embodiments to forming the pin plug hole)

(1) See FIGS. 2A and 2B—1st embodiment is the isotropic etch/anisotropic etch;

(2) See FIGS. 3A/3B & 4A/4B—second embodiment using two layers 30A 30B having etch rate differences and an isotropic etch/anisotropic etch;

f) See FIG. 6A—forming a planarizing layer 44 over the etch barrier layer 34 and the pin plug 42;

g) See FIG. 6A—forming a cylindrical crown hole 46 in the planarizing layer 44 exposing the pin plug 42 and surrounding portions of the etch barrier layer 34;

h) FIG. 6A—depositing a first polysilicon layer 50 over the etch barrier layer, the pin plug 42, and the first planarizing layer 44 thereby partially filling the cylindrical crown hole 46;

i) See FIG. 6A—forming a sacrificial layer 54 over the first polysilicon layer 50 thereby filling the cylindrical crown hole 46;

j) FIG. 7—etching back the sacrificial layer 54 to expose portions of the first polysilicon layer over the planarizing layer 44A and removing the exposed portions of the first polysilicon layer 50; remaining portions of the first polysilicon layer 50 forming a cylindrical crown 50A;

k) See FIG. 9—selectively removing the sacrificial layer 54 thereby forming a cylindrical storage electrode 42 50A;

l) FIG. 9—selectively etching the planarizing layer 44 exposing the etch barrier layer 44 and portions of the pin plug 42 in any areas where the cylindrical crown hole 46 was mis-aligned (See FIG. 8) 60, the pin plug 42 in the upper contact hole 40B protecting the first insulating layer 30 from the selective etch of the planarizing layer 44; and m) See FIG. 9—forming a capacitor dielectric layer 56 and a top electrode (P5) 58 over the cylindrical crown 50A.

The pin shaped plug 42 of the invention increases the photo alignment tolerances between the pin plug 42 and the cylindrical crown 50A. The Pin shaped plug 42 allows a wide top area for the cylindrical electrode 50B to contact while minimizing the spacing between the plug 42 and close conductive layers 26 (e.g., bit lines 26). See FIG. 9. This improves yields because it eliminated etch defects 60 of the first insulating layer 30. See FIGS. 10A–10C. This also reduces manufacturing costs by loosing the photo tolerances while increasing the chip density.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 6A, 6B, 7, and 8 show cross sectional views of the capacitor of the invention where the top cylinder 50 is mis-aligned to the pin plug 42.

FIG. 6A is a cross sectional view of the cylindrical capacitor of the first embodiment of the present invention shown with the cylindrical crown 50 mis-aligned with the pin plug and the pin plug 42 of the invention preventing defects.

FIG. 6B is a cross sectional view of the cylindrical capacitor of the second embodiment of the present invention shown with the cylindrical crown 50 mis-aligned with the pin plug.

FIG. 7 is a cross sectional view of the cylindrical capacitor representing both the first and second embodiments of the present invention shown with the cylindrical crown 50 mis-aligned with the pin plug during the etch back steps and the pin plug 42 of the invention preventing defects.

FIG. 8 is a cross sectional view of the completed cylindrical capacitor representing first and second embodiments of the present invention shown with the cylindrical crown 50 mis-aligned with the pin plug.

FIG. 9 is a cross sectional view of the cylindrical capacitor of the present invention shown with the cylindrical crown 50 properly aligned with the pin plug.

DETAILED DESCRIPTION OF THE PREFERRED EMBODIMENT

The present invention will be described in detail with reference to the accompanying drawings. The present invention provides a method of forming a cylindrical crown capacitor for a memory device.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

It should be recognized that many publications describe the details of common techniques used in the fabrication process of integrate circuit component. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

Figure 1:
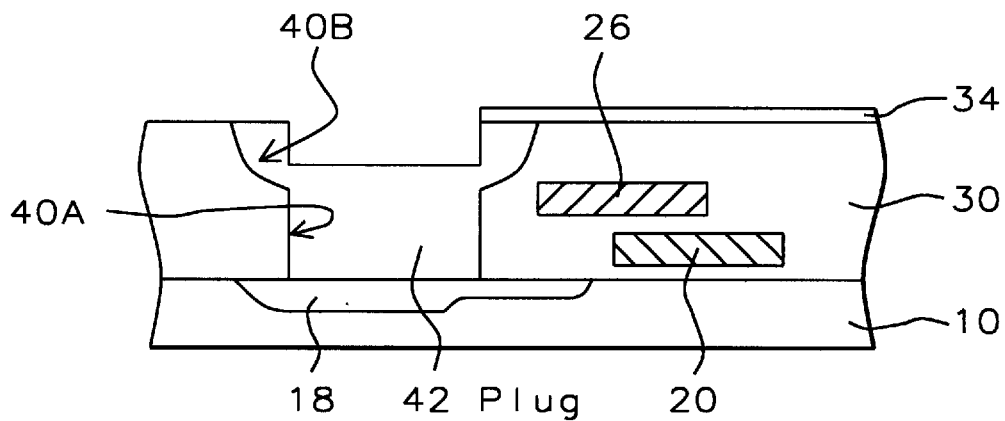
FIGS. 1, 6A, 6B, 7,8 and 9 show cross-sectional views for illustrating a method for manufacturing the cylindrical capacitor according to the present invention.
Figure 6A:
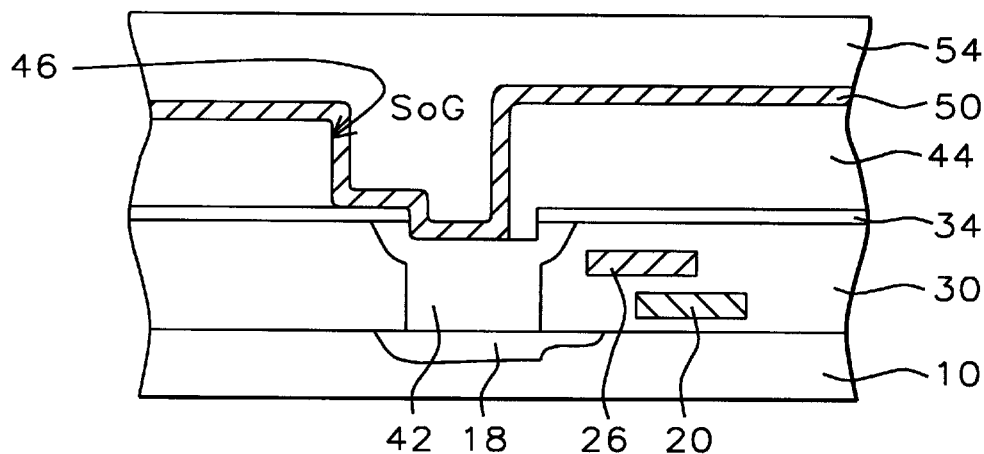

As shown in FIG. 1, device structures 20 are formed within the device areas on a substrate 10. The substrate 10 preferably includes a storage node contact region 18 (e.g., source region). The device structures 20 preferably comprise a gate structure 20 and can comprise other conductive layers such as bit lines 26. Furthermore, as shown in FIG. 6A a bit line 26 cam be formed over the gate structure 20. Layer 30 can be made up of more than one dielectric layer.

The invention can be implemented on logic with embedded memory, standard memory or embedded memory. The pin plug can be implemented on the access transistor of the DRAM cell.

The substrate 10 is understood to possibly include a semiconductor wafer, active and passive devices formed within the wafer and layers formed on the wafer surface.

Still referring to FIG. 1, a first insulating layer 30 is formed over the device structures 20 and the substrate 10. The invention has two embodiments to forming the first insulating layer. The first embodiment, the first insulating layer is formed of one or more layer, all composed of the same material. In a second embodiment shown in FIG. 6A, the first insulating layer 30 is composed of two layers 30A and 30B.

In the first embodiment, the first insulating layer is preferably composed of silicon oxide, borophosphosilicate glass (BPSG), silicon oxide, and BPTEOS. The first insulating layer 30 preferably has a thickness in a range of between about 3000 and 5000 Å.

Figure 6B:
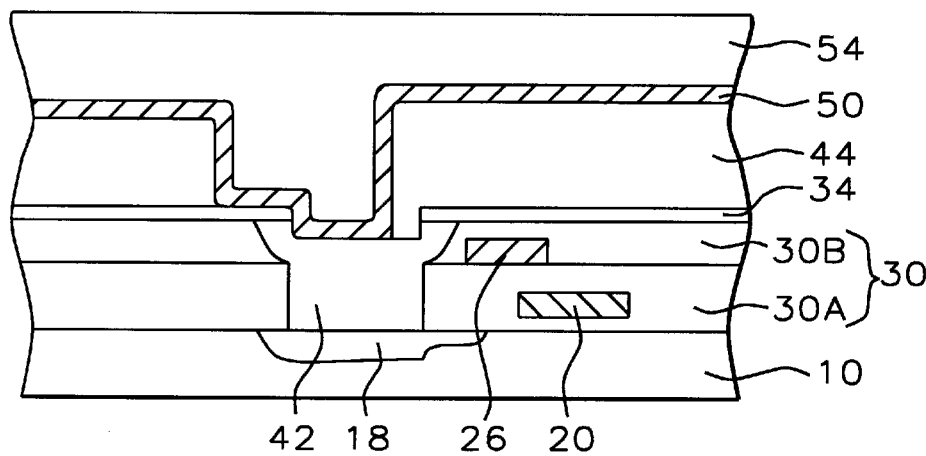

As shown in FIG. 6B, in a second embodiment of the invention to forming the first insulating layer. The first insulating layer 30 is composed of at least two layers: a lower layer 30A and an upper layer 30B. The upper layer 30B has a faster etch rate than the lower layer 30A. The lower layer is preferably composed of Undoped Silicate Glass (USG). The upper layer is preferably composed of borophosphosilicate glass.

As shown in FIG. 1, an etch barrier layer 34 is preferably formed over the first insulating layer 30 (30A 30B). The etch barrier layer 34 is preferably composed of silicon nitride or silicon oxynitride and is most preferably composed of $Si_3N_4$. The etch barrier layer 34 preferably has a thickness in a range of between about 150 and 1000 Å.

In an important step in the invention, a pin plug hole 40 (40A 40B) is formed through to the etch barrier layer 34 and the first insulating layer 30 to expose the capacitor node contact region on the substrate. See FIG. 1. The pin plug hole 40 is comprised of a cylindrical lower plug hole 40A and an wide hemispherical upper plug hole 40B. The hemispherical upper plug hole 40B has a larger diameter than the cylindrical lower plug hole 40A thereby increasing the contact area between the pin plug 42 and the crown portion 50A of the bottom electrode. See FIG. 4.

The pin plug hole 40 is described as composed of two hole parts: a cylindrical lower plug hole 40A and an hemispherical upper plug hole 40B. The lower plug hole 40A has a smaller open dimension than the hemispherical upper plug hole 40B.

Figure 5A:
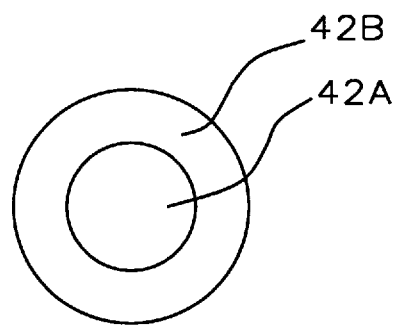
FIGS. 5A and 5B are top plan views of the cylindrical capacitor of the present invention.
Figure 5B:
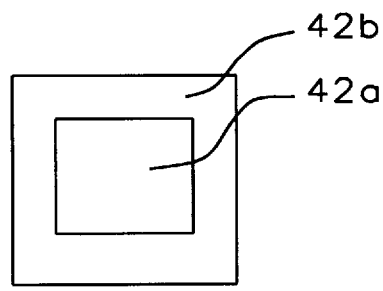
Figure 5C:
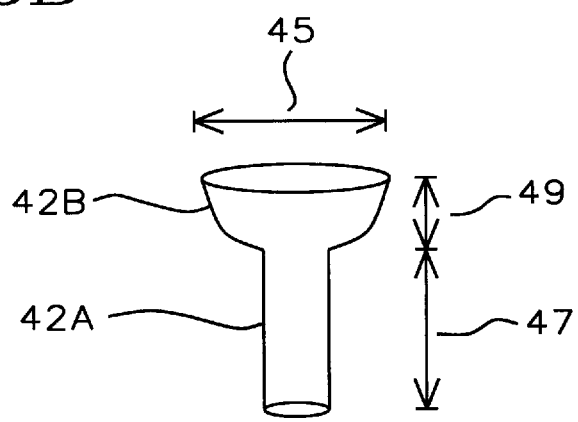
FIG. 5C is a side view of the pin plug 42 of the present invention.

As shown in FIG. 5C, the lower contact hole 30A has an open dimension 43 preferably in a range of between about 0.3 and 0.4 μm and the a hemispherical upper plug hole 40B preferably has an open dimension 45 in a range between about 0.5 and 0.6 μm.

FIGS. 5A and 5B show top plan views of possible shapes of the pin plug.

There are two preferred embodiments for forming the pin plug hole 40.

TABLE

Two Preferred Embodiments For Forming The Pin Plug Hole 40

Figure 2A:
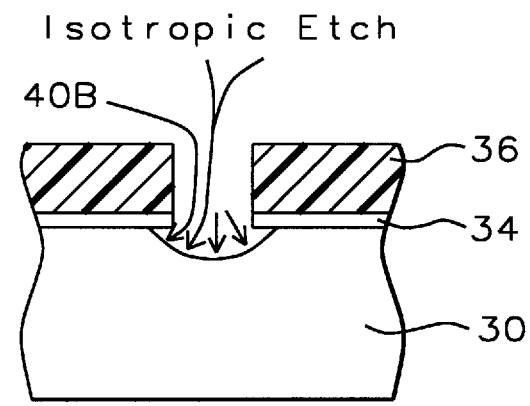
FIGS. 2A and 2B are cross sectional views for illustrating a first embodiment to form the pin plug hole 42.
Figure 2B:
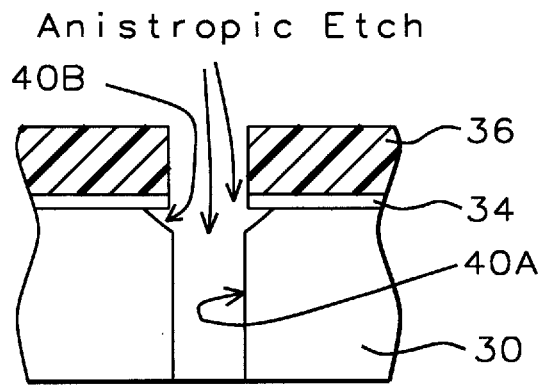
Figure 3A:
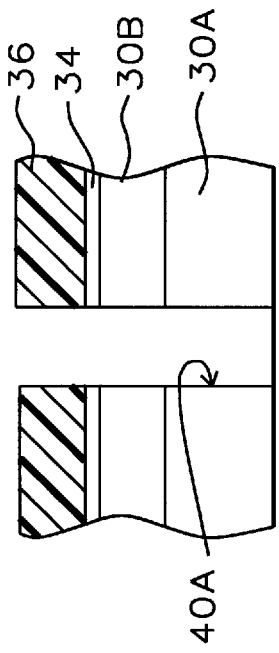
FIGS. 3A and 3B are cross sectional views for illustrating a second embodiment to form the pin plug hole 42.
Figure 4A:
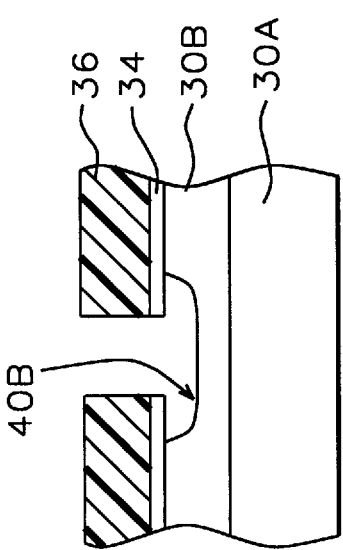
FIGS. 4A and 4B are cross sectional views for illustrating another embodiment in the second embodiment to form the pin plug hole 42.
Figure 3B:
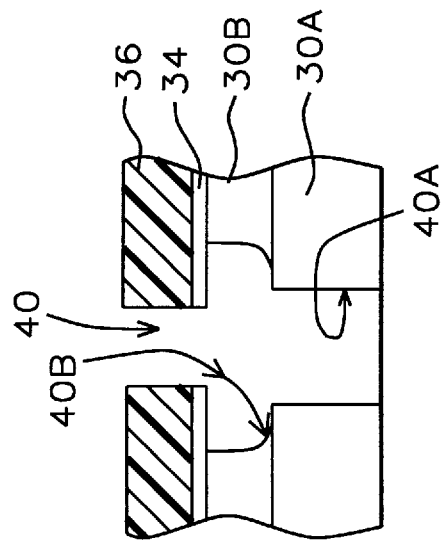
Figure 4B:
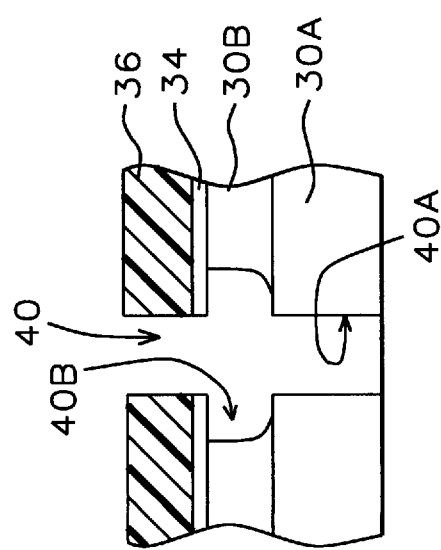

| First embodiment - FIGS. 2A and 2B | Second embodiment - FIG. 6B |
|---|---|
| first insulating layer 30 | first insulating layer 30 composed two layers 30A and 30 with different etch rates |
| Etch process | Etch Process |
| isotropic etch - | FIG. 3A—wet - isotropic etch - |
| Anisotropic etch | FIG. 3B—dry - anisotropic etch |
| | FIG. 4A dry - anisotropic etch |
| | FIG. 4B—wet - isotropic etch - |

In the first embodiment, as shown in FIGS. 2A & 2B, the pin plug hole 40 formed by a first anisotropic etch and a second isotropic etch.

TABLE

Preferred Etch Parameters For The First Embodiment

| Etch step | Preferred parameters - first embodiment |
|---|---|
| isotropic etch | BOE, HF or BHF |
| anisotropic etch | F based |

In the second embodiment, the pin plug hole 40 is formed in an insulating layer 30 comprised of at least two layers: a lower layer 30A and an upper layer 30B. The upper layer 30B has a faster etch rate in HF, BHF or BOE than the lower layer 30A. The lower layer is preferably composed of USG and preferably has a thickness in a range of between about 1000 and 5000 Å. The upper layer is preferably composed of borophosphosilicate glass (BPSG) or BPSG formed using TetraEthylOrthoSilicate (TEOS), and most preferably of borophosphosilicate glass and preferably has a thickness in a range of between about 1000 and 3000 Å.

| Second embodiment - FIGS. 3A 3B 4A & 4B | Preferred parameters |
|---|---|
| first insulating layer 30 composed two layers 30A and 30 with different etch rates | |
| Etch Process | |
| wet - isotropic etch - dry - anisotropic etch | HF, BHF, or BOE F based |

As shown in FIG. 6A, a pin plug 42 is now formed filling the pin plug hole 40 making electrical and mechanical contact with the storage node contact region 18 in the substrate 10.

The pin plug 42 is preferably composed of doped polysilicon. The pin plug is preferably formed by depositing a layer of doped polysilicon with a thickness in a range of between about 4000 and 6000 Å, and etching back the layer of doped polysilicon.

Referring to FIG. 5C the pin plug 42 has the following preferred dimensions.

| element # | name | Low limit | High Limit |
|---|---|---|---|
| 43 | diameter of cylindrical low plug 42A | 0.3 μM | 0.4 μm |
| 45 | diameter of hemispherical upper plug 42B | 0.5 μm | 0.6 μm |
| 47 | height of cylindrical low plug 42A | 1000 Å | 5000 Å |
| 49 | height hemispherical upper plug 42B | 1000 Å | 3000 Å |

Referring to FIG. 6A, a planarizing layer 44 is formed over the etch barrier layer 34 and the pin plug 42.

The planarizing layer 44 is preferably composed of a borophosphosilicate glass, silicon oxide, and spin-on-glass (SOG), and is most preferably composed of BPSG. The planarizing layer 44 preferably has a thickness in a range of between about 3000 and 6000 Å.

Next, a cylindrical crown hole 46 (e.g., crown hole) is formed in the planarizing layer 44 exposing the pin plug 42 and surrounding portions of the etch barrier layer 34. FIGS.

Figure 9:
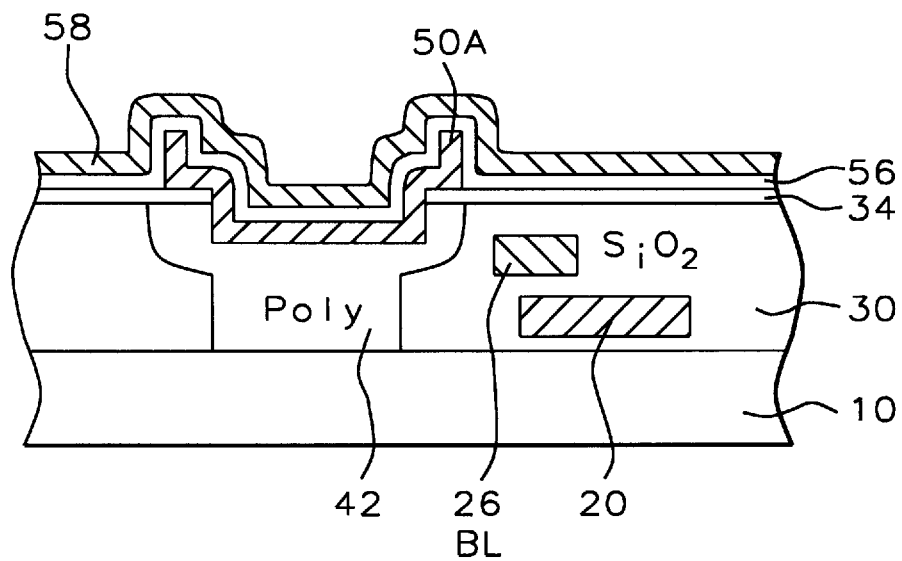

6A and 6B show the cylindrical crown hole 46 misaligned with respect to the plug 42. FIG. 9 shows a capacitor where the hole aligned properly. The cylindrical crown hole 46 is used to form the crown or cylindrical crown portion 50A of the cylindrical storage electrode 50A 42 (bottom storage electrode) of the capacitor.

The cylindrical crown hole 46 preferably has an open dimension in a range of between about 0.4 and 1.0 μm. The cylindrical crown hole 46 can have a circular, square or rectangular shape.

Still referring to FIG. 6A, a first polysilicon layer (e.g., P4) 50 is deposited over the etch barrier layer 34, the pin plug 42, and the first planarizing layer 44 thereby partially filling the cylindrical crown hole 46. The first polysilicon layer (e.g., P4) 50 is preferably composed of doped polysilicon and preferably has a thickness in a range of between about 500 and 1000 Å.

Subsequently, a sacrificial layer 54 is formed over the first polysilicon layer 50 thereby filling the cylindrical crown hole 46 46. The sacrificial layer 54 is formed of a material selected from the group consisting of SOG, BPSG, silicon oxide and BPTEOS and most preferably composed of SOG. The sacrificial layer preferably has a thickness in a range of between about 3000 and 9000 Å.

Figure 7:
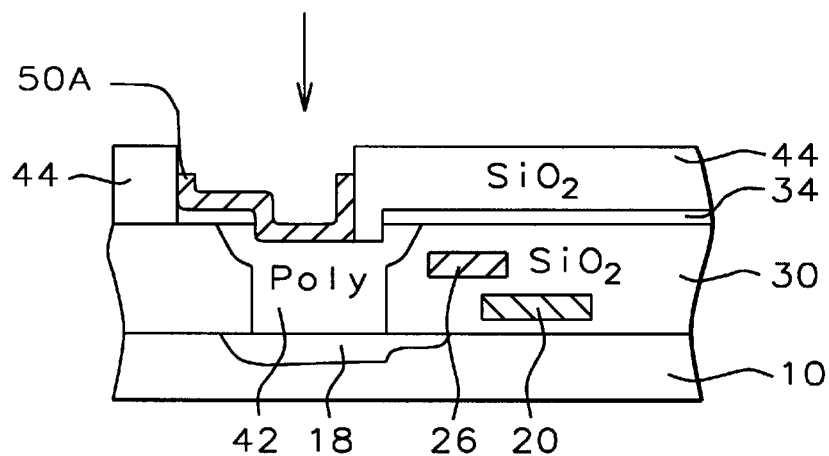

Turning to FIG. 7, the sacrificial layer 54 is etched back to expose portions of the first polysilicon layer 50 over the planarizing layer 44A. The sacrificial layer 54 is etched back using a HF, BHF, or F based etch.

Next, the exposed portions of the first polysilicon layer 50 over the top of the planarizing layer 44A are removed using a etch back or CMP process and more preferably an etch back. The remaining portions of the first polysilicon layer 50A form a crown top 50A. The pin plug 42 and the crown top (cylindrical top) 50A comprise the bottom electrode of the capacitor of the invention.

The sacrificial layer 54 is selectively removed thereby forming a bottom electrode (storage electrode) 42 50A. Preferably a HF etch is used to remove the sacrificial layer 54.

Turning to FIG. 9, the planarizing layer 44 is selectively etched exposing the etch barrier layer 44 and the pin plug 42. Preferably the planarizing layer is etched back using a wet etch such as HF or BHF etch.

Subsequently, as shown in FIG. 9, a capacitor dielectric layer 56 and a top electrode (P5) 58 are formed of the over the crown shaped storage electrode 42 50.

A major advantage of the invention is shown in FIGS. 6A, 6B, 7 and 8 where the upper poly cylinder 50A is misaligned to the pin plug 42. It is important to note that in any areas where the second contact opening 46 was mis-aligned, the pin plug 42 in the upper contact hole 40B protects the first insulating layer 30 from the selective etch. This is a major advantage of the invention. If the pin plug 42 is not used, then etch defects would be formed in the first insulating layer. This defect is worsened by misalignment or a short poly plug. See FIGS. 10A–10C and the discussion below.

Illustration Of Mis-Aligned Top Cylinder 50A and the Invention's Pin Plug 42

Figure 10A:
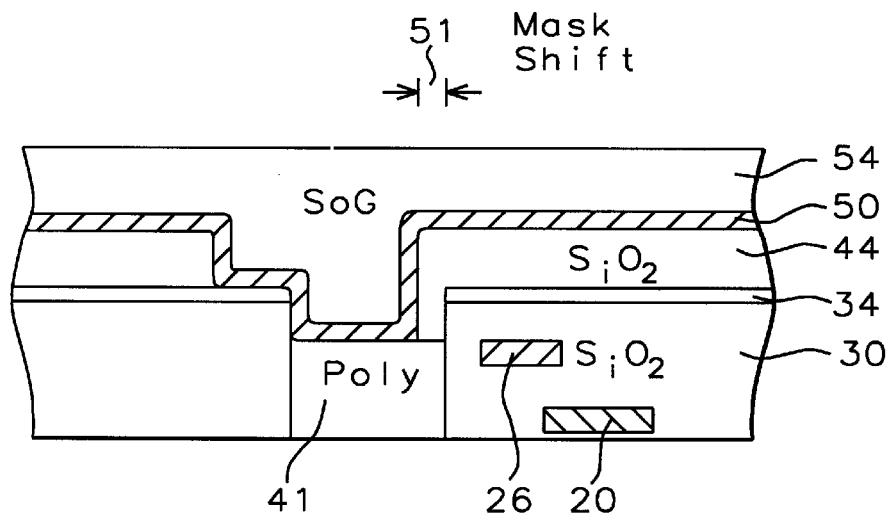
FIGS. 10A, 10B, and 10C are cross sectional views of the applicant's prior process with a straight shaped plug 41 where a misaligned top cylindrical crown 50A caused etch defects 60 in the first insulating layer 30.
Figure 10B:
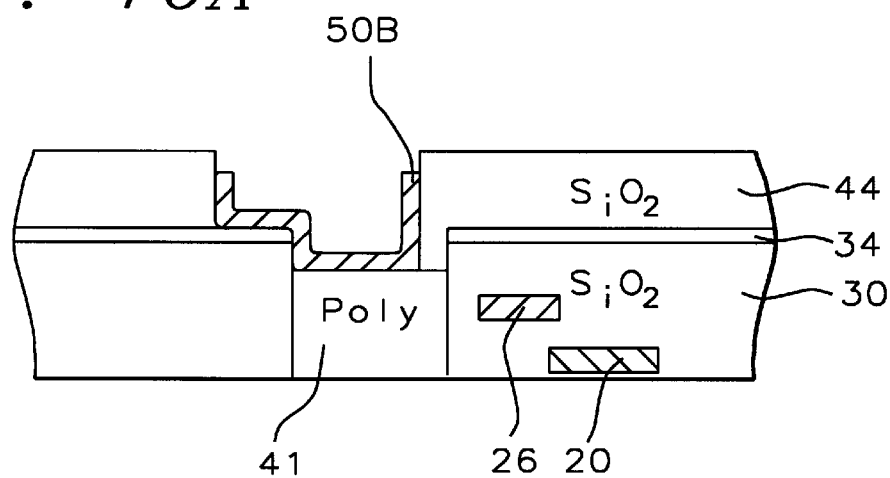
Figure 10C:
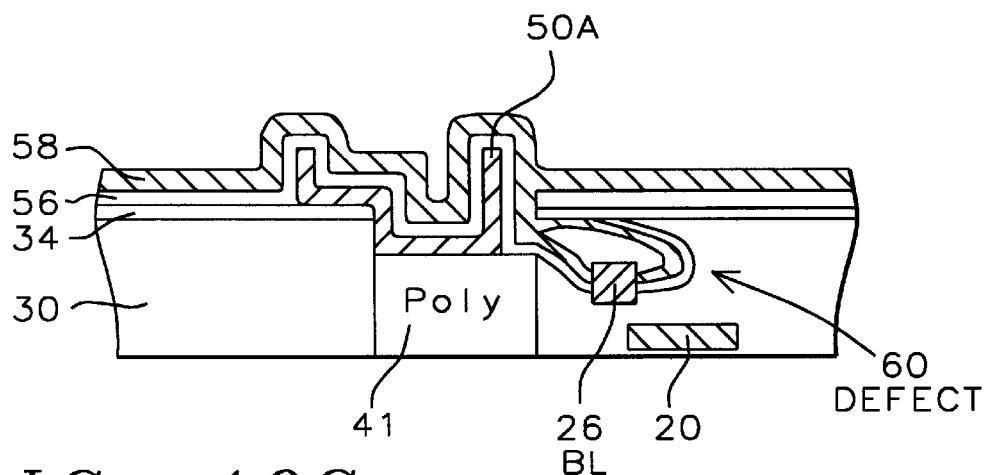

As shown in FIGS. 10A–10C, using a straight shaped plug 41 (not the invention's pin plug 42), the applicant has found a problem when the photomask for the cylindrical crown hole 46 is misaligned to the straight plug 41. As shown in FIG. 10A, the first polysilicon layer 50 only covers a portion of the straight plug 41. The sacrificial layer (e.g., SOG) layer 54 formed over the first polysilicon layer 50 and etched back to fill the cylindrical crown hole 46.

As shown in FIG. 10B, the horizontal exposed first polysilicon layer over the layer 44 is etched away.

As shown in FIG. 10C, the layer 44 is etched away. But because of the misalignment, the crown top 50A does not cover the first insulating layer 30 and the first insulating layer 30 is etched forming a void defect 60. The void defect is filled with parts of the capacitor dielectric layer 56 and the top electrode 58. This leads to the shorting of the top electrode 50 in the void defect 60 shorting to other nearby conductive structures, such as gates 20 and bit-lines 26.

Figure 8:
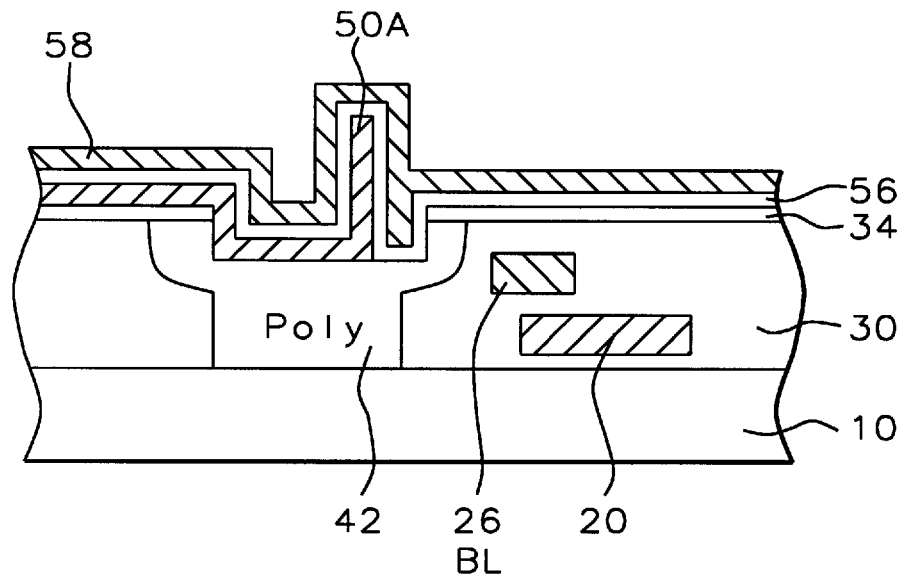

However, using the pin plug 42 with the wide top 40B of the present invention, the photomask misalignment 51 (mask shift) does not create the void defect problem 60 as shown in FIGS. 7 & 8. The wide hemispherical upper plug hole 40B act as an extra etch stop to prevent the etching of the first insulating layer 30.

Discussion Of Differences With The Prior Art

U.S. Pat. No. 5,597,756 (Fazan et al.) shows a method of forming a cylindrical capacitor that takes a different embodiment to solving the void defect problem 60 from the misalignment of the cylindrical portion 50A (Fran element 51 and the bottom plug 42 (Fazan 18A). As shown in Fazan FIGS. 7 and 4, Fazan forms the cylindrical openings 46 (second contact openings) (mold openings 32) much wider than the bottom plug (Fazan 18A) so that the polysilicon layer 41 covers the area over the first insulating layer (Fazan 16). While Fazan's wide cylindrical openings 32(Mold openings) partially relieve the misalignment problem, Fazan's wide openings (Franz 32 ) create wider cylinders 51 than the applicant's cylinders 50A (See FIG. 5). This allows the invention's capacitor to be formed much smaller and more dense. Moreover, the invention increases the plug 42 to cylinder 50A alignment tolerances.

U.S. Pat. No. 5,281,549(Fazan) shows another method of forming a stacked capacitor. Fazan's plug 101 fills in all the space between two adjacent gate structures 32 33 34 35 and has a wider top end than bottom end. However, Fazan does not allow additional devices, such as bit-lines 26 to be formed between the pin plug and the gate structures. As shown in FIG. 5, applicant's process allows bit-lines 26 and other devices (not shown) to be formed in different portions of the first insulating layer 30. This allows for more compact and dense devices. Moreover, the invention increases the plug 42 to cylinder 50A alignment tolerances.

The pin shaped plug opening 40 has a wide top area 40B that increase the contact area for the top cylindrical portion (top Crown) 50A to contact the pin plug 42. The pin plug 42 of the invention increases the photo alignment tolerance between the pin plug 42 and the cylindrical crown 50A. This improves yields because it eliminated etch defects of the first insulating layer 30. See FIGS. 10A–10C. This also reduces manufacturing costs by loosing the photo tolerances while increasing the chip density.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a cylindrical capacitor for a memory device, comprising the steps of:

a) providing a substrate having a node contact region and device structures formed over said substrate;

b) forming a first insulating layer over said device structures and said substrate;

c) forming an etch barrier layer over said first insulating layer;

d) forming a pin plug hole through to said etch barrier layer and said first insulating layer to expose said node contact region on said substrate; said pin plug hole comprised of a cylindrical lower plug hole and a hemispherical upper plug hole; said cylindrical lower plug hole has a smaller open dimension than said a hemispherical upper plug hole;

e) forming a pin plug filling said pin plug hole making electrical and mechanical contact with said capacitor node contact region;

f) forming a planarizing layer over said etch barrier layer and said pin plug;

g) forming a cylindrical crown hole in said planarizing layer exposing said pin plug and surrounding portions of said etch barrier layer;

h) depositing a first polysilicon over said etch barrier layer, said pin plug, and said first planarizing layer partially filling said cylindrical crown hole;

i) forming a sacrificial layer over said first polysilicon layer thereby filling said cylindrical crown hole;

j) etching back said sacrificial layer to expose portions of said first polysilicon layer over said planarizing layer;

k) removing portions of said first polysilicon layer to remove the exposed portions of said first polysilicon layer over the top of said planarizing layer; remaining portions of said first polysilicon layer forming a cylindrical crown;

l) selectively removing said sacrificial layer thereby forming a cylindrical storage electrode;

m) selectively etching said planarizing layer exposing said etch barrier layer and portions of said pin plug in any areas where said cylindrical crown hole was misaligned, said pin plug in the upper contact hole protecting said first insulating layer from the selective etch of said planarizing layer; and n) forming a capacitor dielectric layer and a top electrode over said cylindrical crown.

2. The method of claim 1 wherein said first insulating layer is composed of a material selected from the group consisting of silicon oxide, BPSG, silicon oxide, and BPTEOS.

3. The method of claim 1 wherein said first insulating layer composed of a lower layer and an upper layer; said upper layer has a faster etch rate than said lower layer; and a bit line formed in said lower layer.

4. The method of claim 1 wherein said etch barrier layer composed of a material selected from the group consisting of silicon nitride, and silicon oxynitride, and said etch barrier layer having a thickness in a range of between about 150 and 1000 Å.

5. The method of claim 1 whereinsaid pin plug hole formed by a first isotropic etch and a second anisotropic etch.

6. The method of claim 1 wherein said lower contact hole has an open dimension in a range of between about 0.3 and 0.4 $\mu$m and said hemispherical upper plug hole has an open dimension in a range between about 0.5 and 0.6 $\mu$m.

7. The method of claim 1 wherein said pin plug is composed of doped polysilicon; said pin plug formed by depositing a layer of doped polysilicon with a thickness in a range of between about 4000 and 6000 Å and etching back said layer of doped polysilicon.

8. The method of claim 1 wherein said planarizing layer composed of a material selected from the group consisting of BPSG, silicon oxide, and SOG, and a thickness in a range of between about 3000 and 6000 Å.

9. The method of claim 1 wherein said cylindrical crown hole has an open dimension in a range of between about 0.4 and 1.0 $\mu$m.

10. The method of claim 1 wherein said first polysilicon layer 4, composed of doped polysilicon and having a thickness in a range of between about 500 and 1000 Å.

11. The method of claim 1 wherein said sacrificial layer is formed of a material selected from the group consisting of SOG, BPSG, silicon oxide and BPSG formed using Tetraethylorthosilicate (BPTEOS), and said sacrificial layer having a thickness in a range of between about 3000 and 9000 Å.

12. A method for manufacturing a cylindrical capacitor for a memory device, comprising the steps of:

a) providing a substrate having a node contact region and device structures formed over said substrate;

b) forming a first insulating layer over said device structures and said substrate; said first insulating layer composed of a material selected from the group consisting of silicon oxide, BPSG, silicon oxide, and BPTEOS; a bit line formed in said first insulating layer;

c) forming an etch barrier layer over said first insulating layer;

d) forming a pin plug hole through to said etch barrier layer and said first insulating layer to expose said capacitor node contact region on said substrate; said pin plug hole comprised of a cylindrical lower plug hole and a hemispherical upper plug hole; said pin plug hole formed by a first isotropic etch and a second anisotropic etch;

e) forming a pin plug filling said pin plug hole making electrical and mechanical contact with said node contact region;

f) forming a planarizing layer over said etch barrier layer and said pin plug;

g) forming a cylindrical crown hole in said planarizing layer exposing said pin plug and surrounding portions of said etch barrier layer;

h) depositing a first polysilicon layer over said etch barrier layer, said pin plug, and said first planarizing layer partially filling said cylindrical crown hole;

i) forming a sacrificial layer composed of borophosphosilicate glass over said first polysilicon layer thereby filling said cylindrical crown hole;

j) etching back said sacrificial layer to expose portions of said first polysilicon layer over said planarizing layer;

k) etching the exposed first polysilicon layer over the top of said planarizing layer; remaining portions of said first polysilicon layer forming a cylindrical crown;

l) selectively removing said sacrificial layer thereby forming a cylindrical storage electrode;

m) selectively etching said planarizing layer exposing said etch barrier layer and portions of said pin plug in any areas where said cylindrical crown hole was misaligned, said pin plug in the upper contact hole protecting said first insulating layer from the selective etch of said planarizing layer; and n) forming a capacitor dielectric layer and a top electrode over said cylindrical crown.

13. The method of claim 12 wherein said etch barrier layer is composed of a material selected from the group consisting of silicon nitride and silicon oxynitride, and said etch barrier layer having a thickness in a range of between about 150 and 1000 Å.

14. The method of claim 12 wherein said lower contact hole has an open dimension in a range of between about 0.3 and 0.4 µm and said hemispherical upper plug hole has an open dimension in a range between about 0.5 and 0.6 µm.

15. The method of claim 12 wherein said pin plug composed of doped polysilicon; said pin plug formed by depositing a layer of doped polysilicon with a thickness in a range of between about 4000 and 6000 Å and etching back said layer of doped polysilicon.

16. The method of claim 12 wherein said planarizing layer composed of a material selected from the group consisting of BPSG, silicon oxide, and SOG, and has a thickness in a range of between about 3000 and 6000 Å.

17. The method of claim 12 wherein said cylindrical crown hole having an open dimension in a range of between about 0.4 and 1.0 µm.

18. The method of claim 12 wherein said sacrificial layer is formed of a material selected from the group consisting of SOG, BPSG, silicon oxide and BPSG formed using Tetraethylorthosilicate, and said sacrificial layer having a thickness in a range of between about 3000 and 9000 Å.

19. A method for manufacturing a cylindrical capacitor for a memory device, comprising the steps of:
  a) providing a substrate having a node contact region and device structures formed over said substrate;
  b) forming a first insulating layer over said device structures and said substrate; said first insulating layer composed of a lower layer and an upper layer; said upper layer has a faster etch rate than said lower layer; a bit line formed in said lower layer
  c) forming an etch barrier layer over said first insulating layer;
  d) forming a pin plug hole through to said etch barrier layer and said first insulating layer to expose said capacitor node contact region on said substrate; said pin plug hole comprised of a cylindrical lower plug hole and a hemispherical upper plug hole; said pin plug hole formed by two etches: an anisotropic etch and an isotropic etch;
  e) forming a pin plug filling said pin plug hole making electrical and mechanical contact with said node contact region;
    (1) said pin plug composed of doped polysilicon; said pin plug formed by depositing a layer of doped polysilicon with a thickness in a range of between about 4000 and 6000 Å and etching back said layer of doped polysilicon;
  f) forming a planarizing layer over said etch barrier layer and said pin plug;
  g) forming a cylindrical crown hole in said planarizing layer exposing said pin plug and surrounding portions of said etch barrier layer;
  h) depositing a first polysilicon layer over said etch barrier layer, said pin plug, and said first planarizing layer partially filling said cylindrical crown hole;
  i) forming a sacrificial layer composed of borophosphosilicate glass over said first polysilicon layer thereby filling said cylindrical crown hole;
  j) etching back said sacrificial layer to expose portions of said first polysilicon layer over said planarizing layer;
  k) etching said first polysilicon layer to remove the exposed portions of said first polysilicon layer over the top of said planarizing layer; remaining portions of said first polysilicon layer forming a cylindrical crown;
  l) selectively removing said sacrificial layer thereby forming a cylindrical storage electrode;
  m) selectively etching said planarizing layer exposing said etch barrier layer and portions of said pin plug in any areas where said cylindrical crown hole was misaligned, said pin plug in the upper contact hole protecting said first insulating layer from the selective etch of said planarizing layer; and
  n) forming a capacitor dielectric layer and a top electrode over said cylindrical crown.

20. The method of claim 19 wherein said etch barrier layer composed of a material selected from the group consisting of silicon nitride, and silicon oxynitride, and said etch barrier layer having a thickness in a range of between about 150 and 1000 Å.

21. The method of claim 19 wherein said lower contact hole has an open dimension in a range of between about 0.3 and 0.4 µm and said hemispherical upper plug hole has an open dimension in a range between about 0.5 and 0.6 µm.

22. The method of claim 19 wherein said planarizing layer composed of a material selected from the group consisting of BPSG, silicon oxide, and SOG, and has a thickness in a range of between about 3000 and 6000 Å.

23. The method of claim 19 wherein said cylindrical crown hole having an open dimension in a range of between about 0.4 and 1.0 µ.

24. The method of claim 19 wherein said first polysilicon layer is composed of doped polysilicon and having a thickness in a range of between about 500 and 1000 Å.

25. The method of claim 19 wherein said sacrificial layer is formed of a material selected from the group consisting of SOG, BPSG, silicon oxide and BPSG formed using Tetraethylorthosilicate, and said sacrificial layer having a thickness in a range of between about 3000 and 9000 Å.

* * * * *